US009717167B2

(12) United States Patent
Nishikimi

(10) Patent No.: US 9,717,167 B2
(45) Date of Patent: Jul. 25, 2017

(54) POWER CONVERTER INCLUDING CONTROL CIRCUIT SUBSTRATE ON SIDE SURFACE PART

(71) Applicant: Hitachi Automotive Systems, Ltd., Hitachinaka-shi, Ibaraki (JP)

(72) Inventor: Fusanori Nishikimi, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 25 days.

(21) Appl. No.: 14/902,365

(22) PCT Filed: Jun. 13, 2014

(86) PCT No.: PCT/JP2014/065673
§ 371 (c)(1),
(2) Date: Dec. 31, 2015

(87) PCT Pub. No.: WO2012/025594
PCT Pub. Date: Feb. 26, 2015

(65) Prior Publication Data
US 2016/0374229 A1    Dec. 22, 2016

(30) Foreign Application Priority Data

Aug. 20, 2013 (JP) .................................. 2013-170047

(51) Int. Cl.
*H05K 7/20* (2006.01)
*H02M 7/217* (2006.01)
(Continued)

(52) U.S. Cl.
CPC ............ *H05K 7/209* (2013.01); *H02M 7/003* (2013.01); *H02M 7/217* (2013.01);
(Continued)

(58) Field of Classification Search
CPC .... H05K 7/209; H05K 7/217; H05K 7/20854; H05K 7/20927; H05K 7/20218–7/20272;
(Continued)

(56) References Cited

U.S. PATENT DOCUMENTS 5,831,240 A    11/1998  Katooka et al.
7,177,153 B2 *  2/2007  Radosevich ............ B60L 11/12
                                                              165/80.4
(Continued)

FOREIGN PATENT DOCUMENTS

EP    1 919 069 A2    5/2008
JP    8-275549 A      10/1996
(Continued)

OTHER PUBLICATIONS

International Search Report (PCT/ISA/210) issued in PCT Application No. PCT/JP2014/065673 dated Sep. 16, 2014, with English translation (two (2) pages).
(Continued)

*Primary Examiner* — Zachary M Pape
(74) *Attorney, Agent, or Firm* — Crowell & Moring LLP

(57) ABSTRACT

Cooling performance of a control circuit substrate used in a power converter is improved. A power converter of the present invention includes a power semiconductor module, a passage forming body forming a passage space, a driver circuit substrate, and a control circuit substrate, where the passage forming body forms a first opening for allowing to dispose the power semiconductor module in an opposing manner to the passage space, the driver circuit substrate is disposed at a position opposite to a surface of the passage forming body having the first opening formed thereon, the passage forming body forms a side surface part parallel to an alignment direction of the power semiconductor module and driver circuit substrate, and the control circuit substrate is disposed on the side surface via a protruding portion protruding from the side surface such that a projection of the control circuit substrate matches that of the passage space when a projection is made from a direction perpendicular to the side surface of the passage forming body.

11 Claims, 17 Drawing Sheets

(51) Int. Cl.
   *H02M 7/00* (2006.01)
   *H01L 23/473* (2006.01)
   *H01H 9/52* (2006.01)

(52) U.S. Cl.
   CPC ..... *H05K 7/20854* (2013.01); *H05K 7/20927* (2013.01); *H01H 9/52* (2013.01); *H01L 23/473* (2013.01)

(58) Field of Classification Search
   CPC .... H05K 7/1432; H02M 7/003; H02M 7/217; H01H 9/52; H01L 23/473
   See application file for complete search history.

(56) References Cited

U.S. PATENT DOCUMENTS

| | | | |
|---|---|---|---|
| 9,596,782 B2* | 3/2017 | Nishikimi | H02M 7/003 |
| 2003/0133267 A1 | 7/2003 | Beihoff et al. | |
| 2008/0130223 A1 | 6/2008 | Nakamura et al. | |
| 2015/0029666 A1* | 1/2015 | Kosuga | H02M 3/28 361/699 |

FOREIGN PATENT DOCUMENTS

| | | |
|---|---|---|
| JP | 2008-118753 A | 5/2008 |
| WO | WO 00/17994 A1 | 3/2000 |

OTHER PUBLICATIONS

Extended European Search Report issued in counterpart European Application No. 14837151.1 dated Mar. 30, 2017 (eight (8) pages).

* cited by examiner

POWER CONVERTER INCLUDING CONTROL CIRCUIT SUBSTRATE ON SIDE SURFACE PART

TECHNICAL FIELD

The present invention relates to power converters for converting DC power to AC power or for converting AC power to DC power, and more especially, to a power converter used for a hybrid vehicle or an electric vehicle.

BACKGROUND ART

It is important to improve cooling performance of internal parts of a power converter in order to improve power conversion performance or to achieve downsizing of the power converter. Electronic parts mounted on a control circuit substrate housed in a housing of a power converter are weak against heat. Therefore, the control circuit substrate is required to perform cooling in an effective manner in order to keep electronic parts reasonable with ensured performance.

PTL 1 describes a configuration where heat of a control element is transferred to a cooler via a heat conduction plate supporting the control element, a shelf receiving unit supporting the heat conduction plate, and a housing forming the shelf receiving unit. In line with a demand for downsizing power converters, however, it is required to shorten a heat transfer route to transfer the heat of a control element to a cooler and to improve heat radiation performance of the control element.

CITATION LIST

Patent Literature

PTL 1: WO 2000/17994

SUMMARY OF INVENTION

Technical Problem

A problem of the present invention is to improve cooling performance of a control circuit substrate.

Solution to Problem

A power converter according to the present invention includes: a power semiconductor module having a power semiconductor element for converting a DC current to an AC current; a passage forming body forming a passage space; a driver circuit substrate for driving the power semiconductor element; and a control circuit substrate for controlling the driver circuit substrate, where the passage forming body forms a first opening for allowing to dispose the power semiconductor module in an opposing manner to the passage space, the driver circuit substrate is disposed at a position opposite to a surface of the passage forming body having the first opening formed thereon, the passage forming body forms a side surface part formed parallel to an alignment direction of the power semiconductor module and the driver circuit substrate, and the control circuit substrate is disposed on the side surface part via a protruding portion protruding from the side surface part such that a projection of the control circuit substrate matches a projection of the passage space when a projection is made from a direction perpendicular to the side surface part of the passage forming body.

Advantageous Effects of Invention

The present invention allows for improving cooling performance of a control circuit substrate.

BRIEF DESCRIPTION OF DRAWINGS

FIG. 5 is a general perspective view of a power semiconductor module 300a.

DESCRIPTION OF EMBODIMENTS

Figure 1:
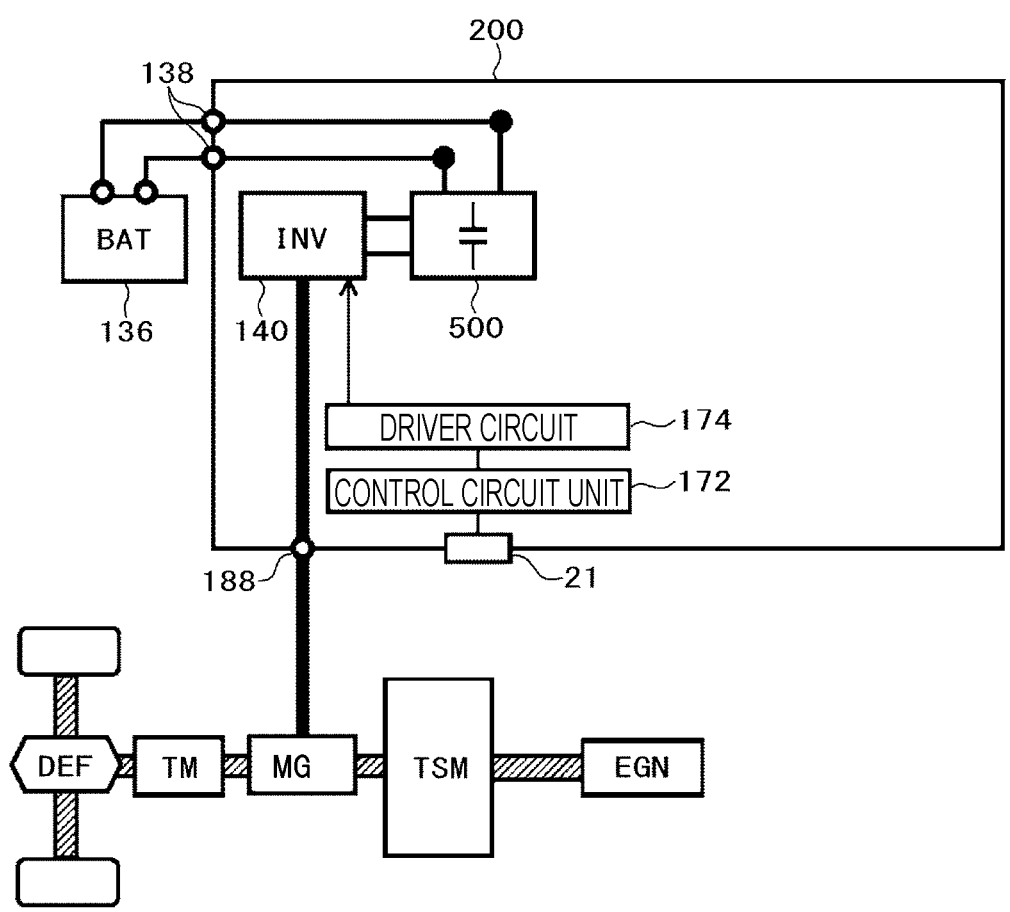
FIG. 1 is a system diagram illustrating a system of a hybrid vehicle.

Next, an embodiment according to the present invention will be described with reference to the drawings. FIG. 1 is a system diagram where a power converter of the present invention is applied to a so-called hybrid vehicle that travels using both an internal engine and an electric motor.

Note that the power converter according to the present invention is applicable not only to a hybrid vehicle but also to a so-called electric vehicle that travels solely by an electric motor and is further usable as a power converter for driving an electric motor used for general industrial machines. Here, as a typical example, the power converter applied to a hybrid vehicle is described.

FIG. 1 is a diagram illustrating a control block of a hybrid vehicle. An internal engine EGN and a motor generator MG are power sources for generating travelling torque of the vehicle. Moreover, the motor generator MG not only generates rotating torque but also has a function to convert mechanical energy (torque) applied to the motor generator MG from outside to power. The motor generator MG is, for example, a synchronous electric motor/generator or an induction motor/generator and thus operates as a motor or a generator depending on an operation method as aforementioned.

An output side of the internal engine EGN is transferred to the motor generator MG via a power distribution mechanism TSM. Rotating torque from the power distribution mechanism TSM or rotating torque generated by the motor generator MG is transferred to wheels via a transmission TM and a differential gear DEF.

Meanwhile, upon travelling by regenerating braking, rotating torque is transferred to from the wheels to the motor generator MG, thereby generating AC power from the rotating torque transferred. The generated AC power is converted to DC power by a power converter 200 as will be described later and then charges a battery 136 of a high voltage. The charged power is again used as travelling energy.

Next, the power converter 200 will be described. An inverter circuit unit 140 is electrically connected to the battery 136 via a DC connector 138, thereby allowing transmission or reception of power between the battery 136 and the inverter circuit unit 140.

When the motor generator MG is operated as an electric motor, the inverter circuit unit 140 generates AC power from DC power supplied from the battery 136 via the DC connector 138 and supplies the AC power to the motor generator MG via an AC terminal 188. A configuration including the motor generator MG and the inverter circuit unit 140 operates as an electric motor/generator unit.

The electric motor/generator unit may operate as an electric motor or as a generator depending on an operation status or operate as one of those as appropriate. Note that, in the present embodiment, by causing the electric motor/generator unit to operate as the electric motor unit with power from the battery 136, the wheels can be driven solely by power from the motor generator MG. Furthermore, in the present embodiment, by causing the electric motor/generator unit to operate as the generator unit by power from the internal engine EGN or power from the wheels to generate power, the battery 136 can be charged.

The power converter 200 includes a capacitor module 500 for filtering DC power supplied to the inverter circuit unit 140.

The power converter 200 includes a connector 21 for communication such as receiving a command from a host control device or transmitting status data to the host control device. A control circuit unit 172 calculates a control amount of the motor generator MG based on the command input from the connector 21.

The control circuit unit 172 further calculates whether to cause to operate as the electric motor or as the generator, generates a control pulse based on the calculation result, and supplies the control pulse to a driver circuit 174. The driver circuit 174 then generates a driving pulse for controlling the inverter circuit unit 140 based on the control pulse.

Figure 2:
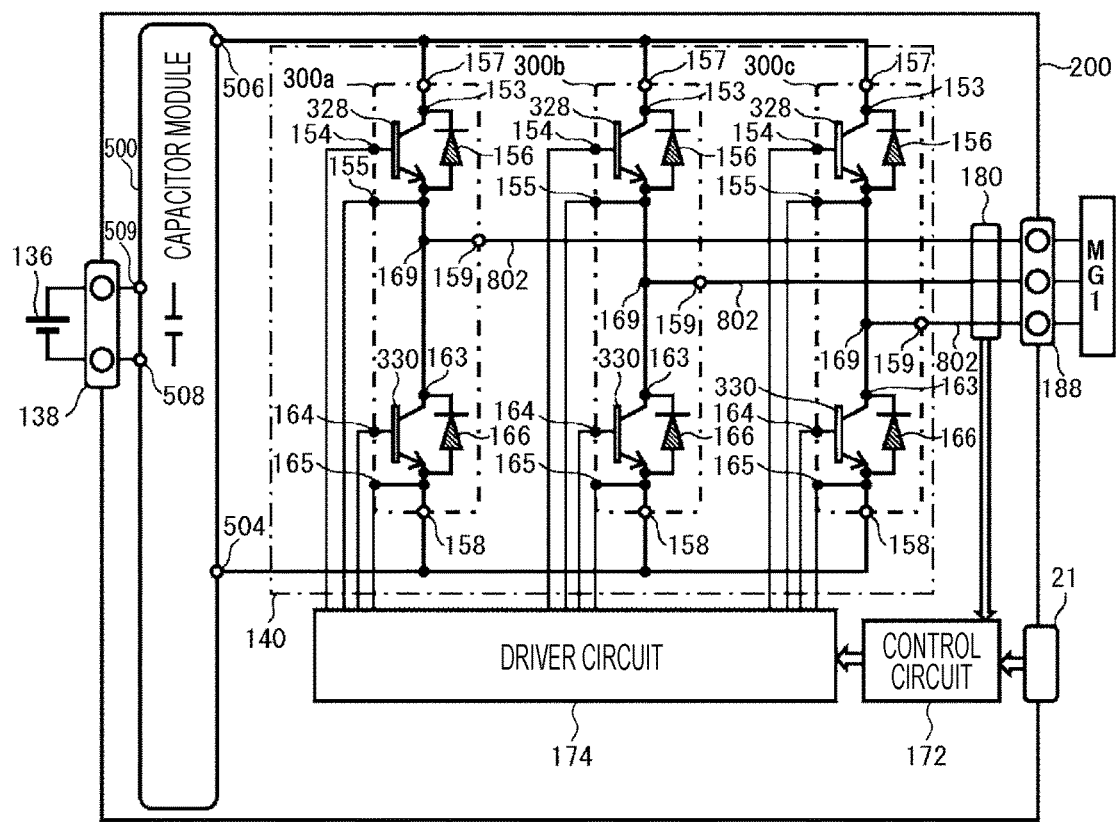
FIG. 2 is a circuit diagram illustrating a configuration of an electric circuit illustrated in FIG. 1.

Next, a circuit configuration of the inverter circuit unit 140 will be described with reference to FIG. 2. Here, a semiconductor element of an insulated gate type bipolar transistor is used, which will be hereinafter abbreviated as IGBT.

The inverter circuit unit 140 includes power semiconductor modules 300a to 300c each corresponding to each of three phases of U phase, V phase, and W phase of AC power for output. The power semiconductor modules 300a to 300c each has an upper arm and a lower arm with an IGBT 328 and a diode 156 operating as the upper arm and an IGBT 330 and a diode 166 operating as the lower arm.

In this embodiment, these three phases correspond to each phase of three phases of armature coils in the motor generator MG. In each of the power semiconductor modules 300a to 300c having the upper and lower arms of three phases, AC power is output from an intermediate electrode 169, which is a central point of each IGBT 328 and each IGBT 330 of the power semiconductor modules 300a to 300c. The AC power is connected to an AC bus bar which is an AC power line to the motor generator MG through an AC terminal 159 and an AC connector 188.

A collector electrode 153 of the IGBT 328 of the upper arm is electrically connected to a positive side capacitor terminal 506 of the capacitor module 500 via a positive terminal 157 while an emitter electrode of the IGBT 330 of the lower arm is electrically connected to a negative side capacitor terminal 504 of the capacitor module 500 via a negative terminal 158.

As described above, the control circuit unit 172 receives a control command from the host control device via the connector 21 and generates and supply, to the driver circuit 174, a control pulse which is a control signal for controlling the IGBT 328 or IGBT 330 included the upper arm or lower arm of the power semiconductor modules 300a to 300c of each phase included in the inverter circuit unit 140 based on the control command.

The driver circuit 174 then, based on the control pulse, supplies a driving pulse for controlling the IGBT 328 or IGBT 330 included the upper arm or lower arm of the power semiconductor modules 150 of each phase to the IGBT 328 or IGBT 330 of each phase.

The IGBT 328 or IGBT 330 performs conduction or blockage based on the driving pulse from the driver circuit 174 and converts DC power supplied from the battery 136 to three-phase AC power. This converted power is supplied to the motor generator MG1.

The IGBT 328 includes the collector electrode 153, a signaling emitter electrode 155, and a gate electrode 154. Also, the IGBT 330 includes a collector electrode 163, signaling emitter electrode 165, and a gate electrode 164.

The diode 156 is electrically connected between the collector electrode 153 and the emitter electrode. Also, the diode 166 is electrically connected between the collector electrode 163 and the emitter electrode.

As a power semiconductor element for switching, a metal-oxide semiconductor field-effect transistor (hereinafter abbreviated as MOSFET) may be used, in which case the diode 156 or the diode 166 is not required. As the power semiconductor element for switching, an IGBT is suitable for a relatively high DC voltage while a MOSFET is suitable for a relatively low DC voltage.

The capacitor module 500 includes a plurality of positive side capacitor terminals 506, a plurality of negative side capacitor terminals 504, a positive side power supply terminal 509 and a negative side power supply terminal 508. A high-voltage DC power from the battery 136 is supplied to the positive side power supply terminal 509 or negative side power supply terminal 508 via the DC connector 138 and then supplied to the inverter circuit unit 140 through the plurality of positive side capacitor terminals 506 or the plurality of negative side capacitor terminals 504 of the capacitor module 500.

On the other hand, DC power having been converted to from AC power by the inverter circuit unit 140 is supplied to the capacitor module 500 through the positive side capacitor terminal 506 or negative side capacitor terminal 504 and then supplied and charged to the battery 136 from the positive side power supply terminal 509 or negative side power supply terminal 508 via the DC connector 138.

The control circuit unit 172 includes a microcomputer for arithmetic processing of a switching timing of the IGBT 328 and IGBT 330. Input information to the microcomputer includes a target torque value required for the motor generator MG, a current value supplied to the motor generator MG from the power semiconductor module 150 having the upper and lower arms, and a magnetic pole position of a rotator of the motor generator MG1.

The target torque value is based on the command signal output from the host control device (not illustrated) and the current value is detected based on a detection signal from a current sensor. The magnetic pole position is detected based on a detection signal output from a rotating magnetic pole sensor (not illustrated) such as a resolver provided to the motor generator MG.

Figure 3:
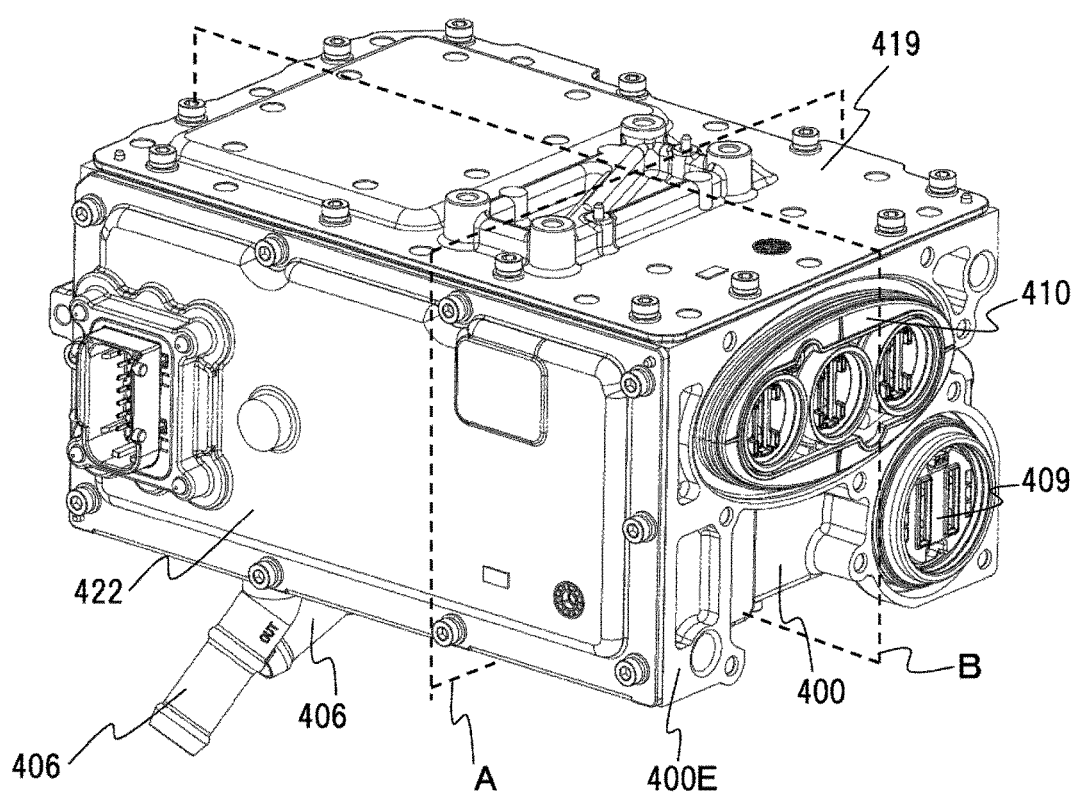
FIG. 3 is an external view of a power converter 200.
Figure 4:
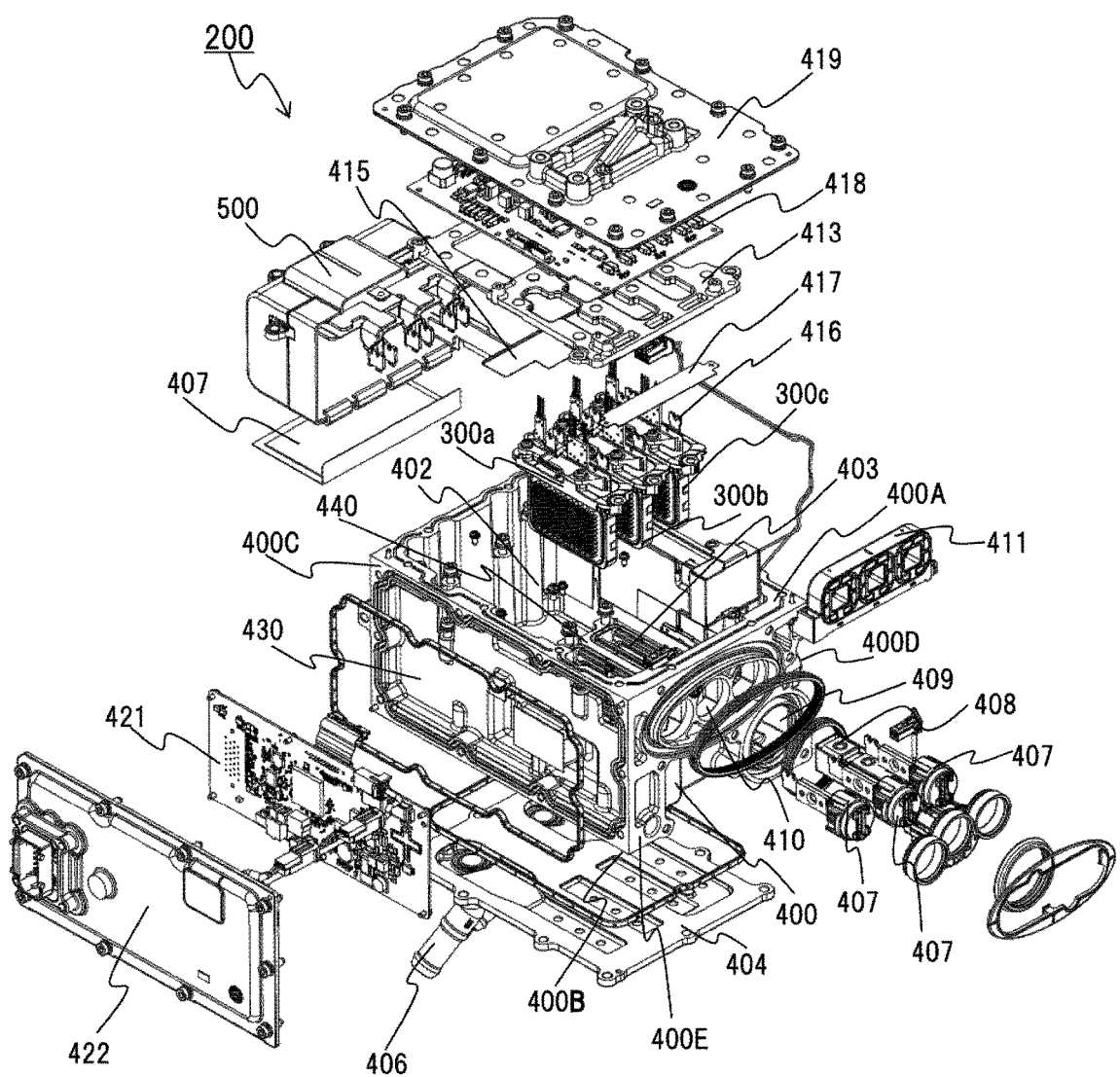
FIG. 4 is an external view of the power converter 200.

FIG. 3 is an external view of the power converter 200. FIG. 4 is an external view of the power converter 200.

A housing 400 is made from a metal, for example, an aluminum alloy and has a cuboid box shape having a pair of short side walls and long side walls. The housing 400 houses the capacitor module 500, power semiconductor modules 300a to 300c, control circuit unit 172, driver circuit 174, etc. The housing 400 includes a first long side wall 400A forming an opening for inserting the capacitor module 500 or the power semiconductor modules 300a to 300c or the like, a second long side wall 400B for fixing a lower cover 404, a first short side wall 400C for fixing a side cover 422, and a second short side wall 400D opposite to the first short side wall 400C. A pipe 406 is provided to the lower cover 404 and allows a coolant to flow in or flow out.

A passage forming body 440 is disposed at a bottom part of the housing 400. In the present embodiment, the passage forming body 440 is formed integrally with the housing 400 by aluminum casting, resin molding, or the like. The coolant flows in the pipe 406, passes a passage space formed between the lower cover 404 and the passage forming body 440, further passes a passage space (to be described later) in the passage forming body 440 and then flows out from the pipe 406.

The capacitor module 500 is disposed at a storage part 402 provided at a side part of the passage forming body 440. A heat radiation sheet 407 is disposed between a lower wall of the storage part 402 and the capacitor module 500. The heat radiation sheet 407 has a heat radiation function of releasing the heat of the capacitor module 500 to the housing 400, lower cover 404, or passage forming body 440 and further has a function of insulating the housing 400, lower cover 404, or passage forming body 440.

Three openings 403 are formed on a top surface of the passage forming body 440. The opening 403 communicates with the passage space (to be described later) in the passage forming body 440.

Each of the power semiconductor modules 300a to 300c is inserted to the passage space from the three openings 403. Therefore, the power semiconductor modules 300a to 300c having a liquid-tight configuration themselves and the passage forming body 440 together seals the inside of the passage space is with a seal packing or the like. This results in a configuration where the power modules 300a to 300c are cooled by directly contacting the coolant.

A DC side storage opening 409 and an AC side storage opening 410 are formed in a side wall 400E provided near the passage forming body 440. The DC terminal 408 is housed in the DC side storage opening 409. Three AC terminals 470 are housed in the AC side storage opening 410.

Three AC connecting bus bars 416 connects the AC terminal 470 and each of the power semiconductor modules 300a to 300c. A current sensor 411 is disposed in a space between the power semiconductor modules 300a to 300c and the side wall 400E.

A cooling board 413 is disposed in such a manner as to cover an upper part of the capacitor module 500, power semiconductor modules 300a to 300c, or current sensor 411. In the present embodiment, the cooling board 413 is fixed to the housing 400 and transfers heat to the housing 400. Note that the cooling board 413 may be directly fixed to the passage forming body 440. This allows the cooling board 413 to release heat from the capacitor module 500 and heat from the AC connecting bus bar 416 to the passage forming body 440. A heat radiation sheet 415 is disposed between the capacitor module 500 and the cooling board 413 and releases heat of the capacitor module 500 to the cooling board 413.

A heat radiation sheet 417 is disposed between the AC connecting bus bar 416 and the cooling board 413 and releases heat of the electric motor flowing in from the AC terminal 408 to the cooling board 413 via the AC connecting bus bar 416 and the heat radiation sheet 417.

A driver circuit substrate 418 is disposed pt an opposite side to the power semiconductor modules 300a to 300c across the cooling board 413. An upper cover 419 is fixed to the housing 400 with a housing fixing screw 420 in such a manner as to cover an opening of the first long side wall 400A.

A control circuit substrate 421 is disposed at a side surface part 430 provided to the first short side wall 400C.

Figure 5:
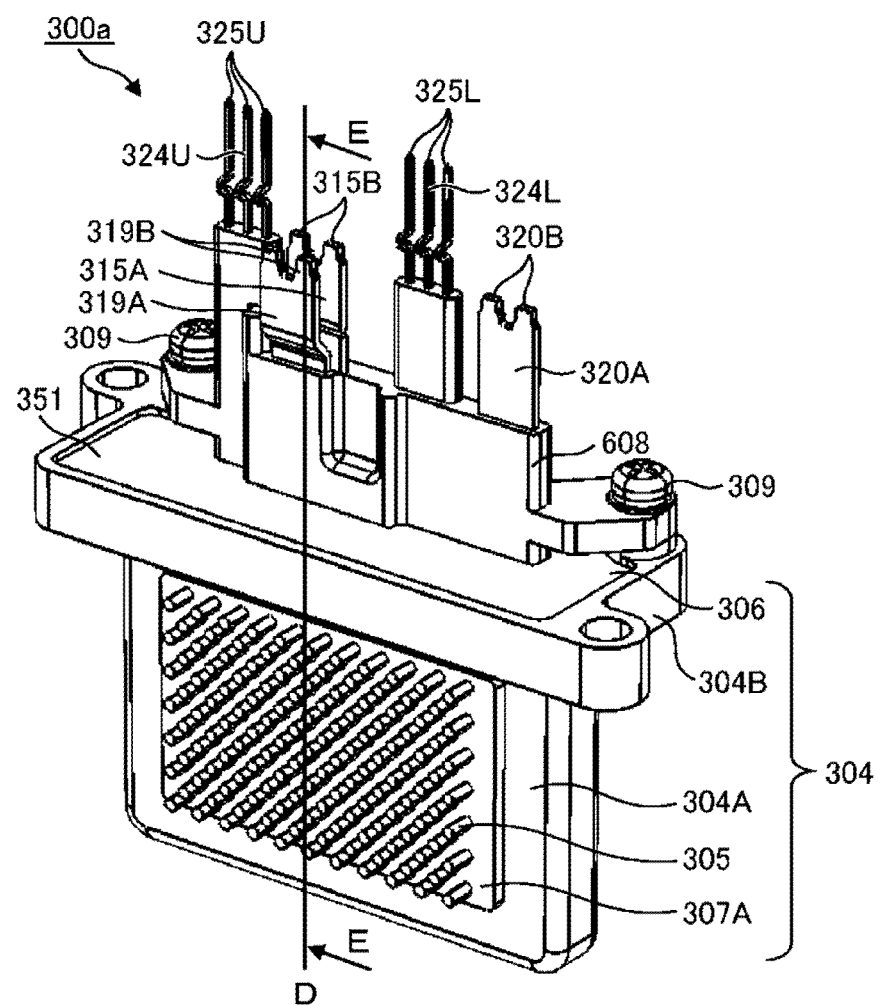
Figure 6:
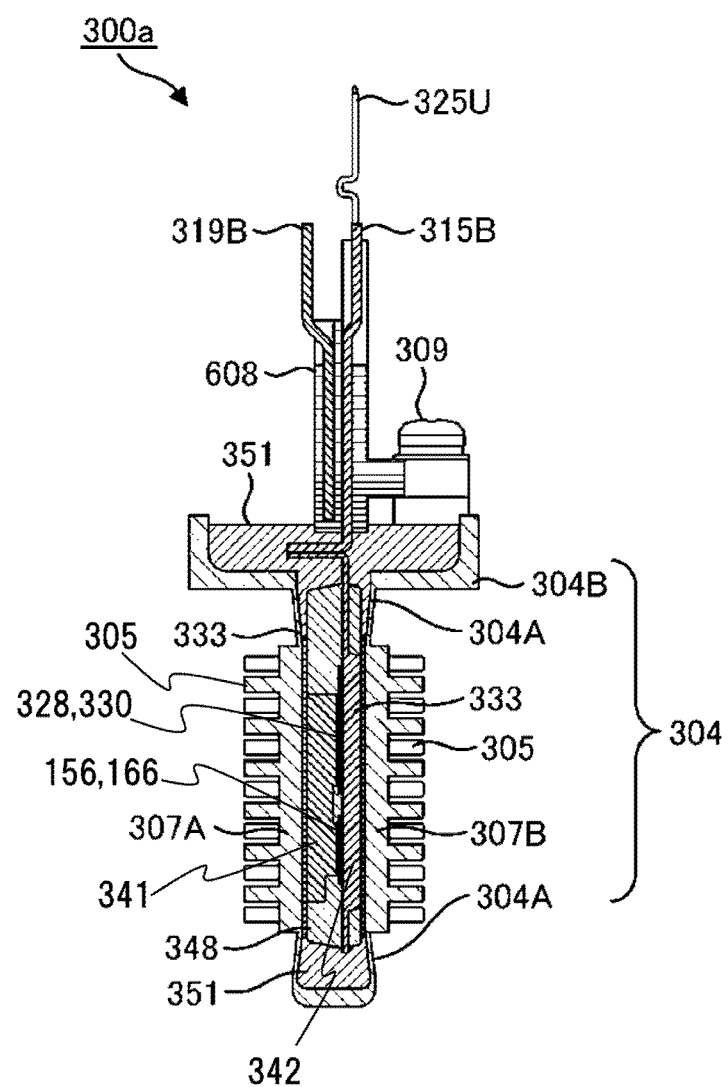
FIG. 6 is a cross-sectional view of the power semiconductor module 300a according to the present embodiment cut along a cross section D and seen from a direction E.

FIG. 5 is a general perspective view of a power semiconductor module 300a. FIG. 6 is a cross-sectional view of the power semiconductor module 300a according to the present embodiment cut along a cross section D and seen from a direction E. Any of the power semiconductor modules 300a to 300c has the same configuration. A configuration of the power semiconductor module 300a will be described as a typical example. Note that a signal terminal 325U in FIG. 5 corresponds to the gate electrode 154 and the signaling emitter electrode 155 disclosed in FIG. 2. A signal terminal 325L corresponds to the gate electrode 164 and the emitter electrode 165 disclosed in FIG. 2. Also, a DC positive terminal 315B is identical with the positive terminal 157 disclosed in FIG. 2 while the DC negative terminal 319B is identical with the negative terminal 158 disclosed in FIG. 2. Moreover, an AC terminal 320B is identical with the AC terminal 159 disclosed in FIG. 2.

As illustrated in FIG. 6, the IGBT 328, IGBT 330, diode 156 and diode 166 are interposed between a conductor plate 341 and a conductor plate 342 and fixed to the conductor plate 341 and conductor plate 342 via solder. In the present embodiment, the IGBT 328, IGBT 330, diode 156 and diode 166 function as a power semiconductor element.

As illustrated in FIG. 6, a module case 304 is formed by a member having electrical conductivity, for example, by an aluminum alloy material (Al, AlSi, AlSiC, Al—C, etc.). An insertion opening 306 is formed on one surface of the module case 304 and receives the conductor plate 341, conductor plate 342, etc. A flange 304B is formed in such a manner as to encircle an outer periphery of the insertion opening 306. A first heat radiation surface 307A is disposed at a position opposite to a second heat radiation surface 307B via the IGBT 328, GBT 330, etc.

The first heat radiation part 307A and second heat radiation surface 307B has a wider area than other areas of the module case 304, thereby improving heat radiation performance. Using a metal module case 304 in such a shape allows for preventing the coolant from entering inside the module case 304 with a simple configuration since sealing against the coolant can be ensured by a flange 304B even when the module case 304 is inserted inside a coolant passage 19 where the coolant such as water or oil flows. A fin 305 is formed in each of the first heat radiation part 307A and the second heat radiation part 307B. A thin part 304A is formed in an outer periphery of the first heat radiation surface 307A and second heat radiation surface 307B and is formed extremely thinner than the first heat radiation surface 307A and second heat radiation surface 307B. A thickness of the thin part 304A is made extremely thin to an extent that the thin part 304A is easily deformed by applying a pressure to the first heat radiation part 307A or second heat radiation part 307B. Therefore, productivity after the conductor plate 341 and conductor plate 342 are inserted is improved.

The conductor plate 341 and conductor plate 342 are sealed with a first sealing resin 348 with a portion thereof being exposed. An exposed surface of the conductor plate 341 and conductor plate 342 is bonded with an insulating sheet 333 by thermocompression. This allows for reducing void space between a conductor plate 315 and an inner wall of the module case 304, thereby allowing for effective transfer of heat generated by the power semiconductor element to the fin 305. Furthermore, by allowing the insulating sheet 333 to have sufficient thickness and elasticity, the insulating sheet 333 can absorb generated thermal stress. This is preferable for use in a power converter for vehicles with drastic temperature changes.

As illustrated in FIG. 5, a DC positive wiring 315A and a DC negative wiring 319A protrude from the insertion opening 306 and are electrically connected to the capacitor module 500. A DC positive terminal 315B (157) is formed at a tip of the DC positive wiring 315A. A DC negative terminal 319B (158) is formed at a tip of the DC negative wiring 319A. An AC wiring 320A protrudes from the insertion opening 306 and supplies AC power to the motor generator MG1 or MG2. An AC terminal 320B (159) is formed at a tip of the AC wiring 320A.

A signal wiring 324U and a signal wiring 324l, protrude from the insertion opening 306 and are electrically connected to the driver circuit 174. The signal terminal 325U (154, 155) and signal terminal 325L (164, 165) are formed at tips of the signal wiring 324U and signal wiring 324L. As illustrated in FIG. 6, a wiring insulation part 608 is disposed between the DC positive wiring 315A and DC negative wiring 319A. This allows a current that instantaneously flows upon switching operation of the power semiconductor element to flow in an opposite direction. As a result, magnetic fields created by the current are canceled with each other. This action allows for reducing inductance. Note that the AC wiring 320A or signal terminals 325U and 325L also extend in a direction similar to that of the DC positive wiring 315A and DC negative wiring 319A.

Figure 7:
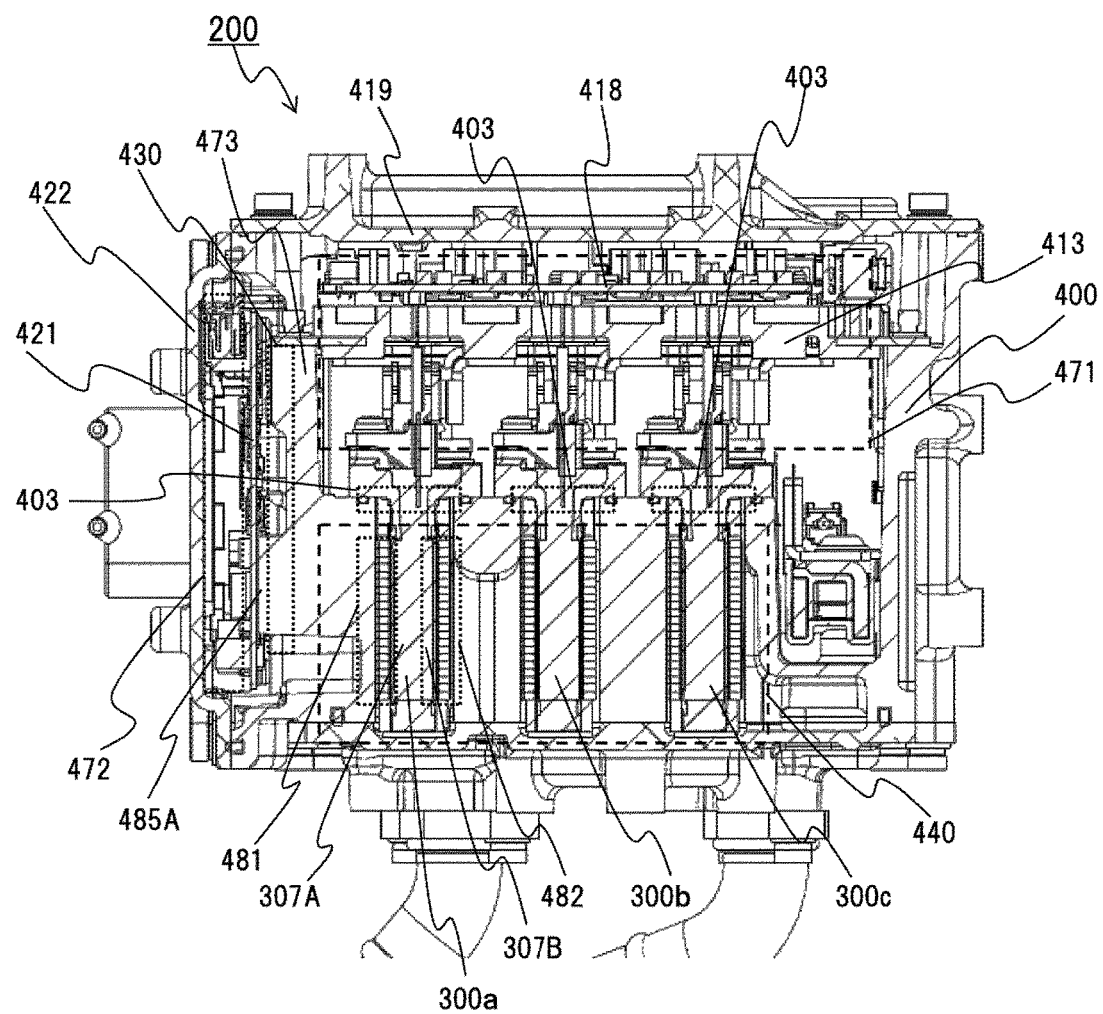
FIG. 7 is a cross-sectional view of the power converter 200 cut along a plane A illustrated in FIG. 3.
Figure 8:
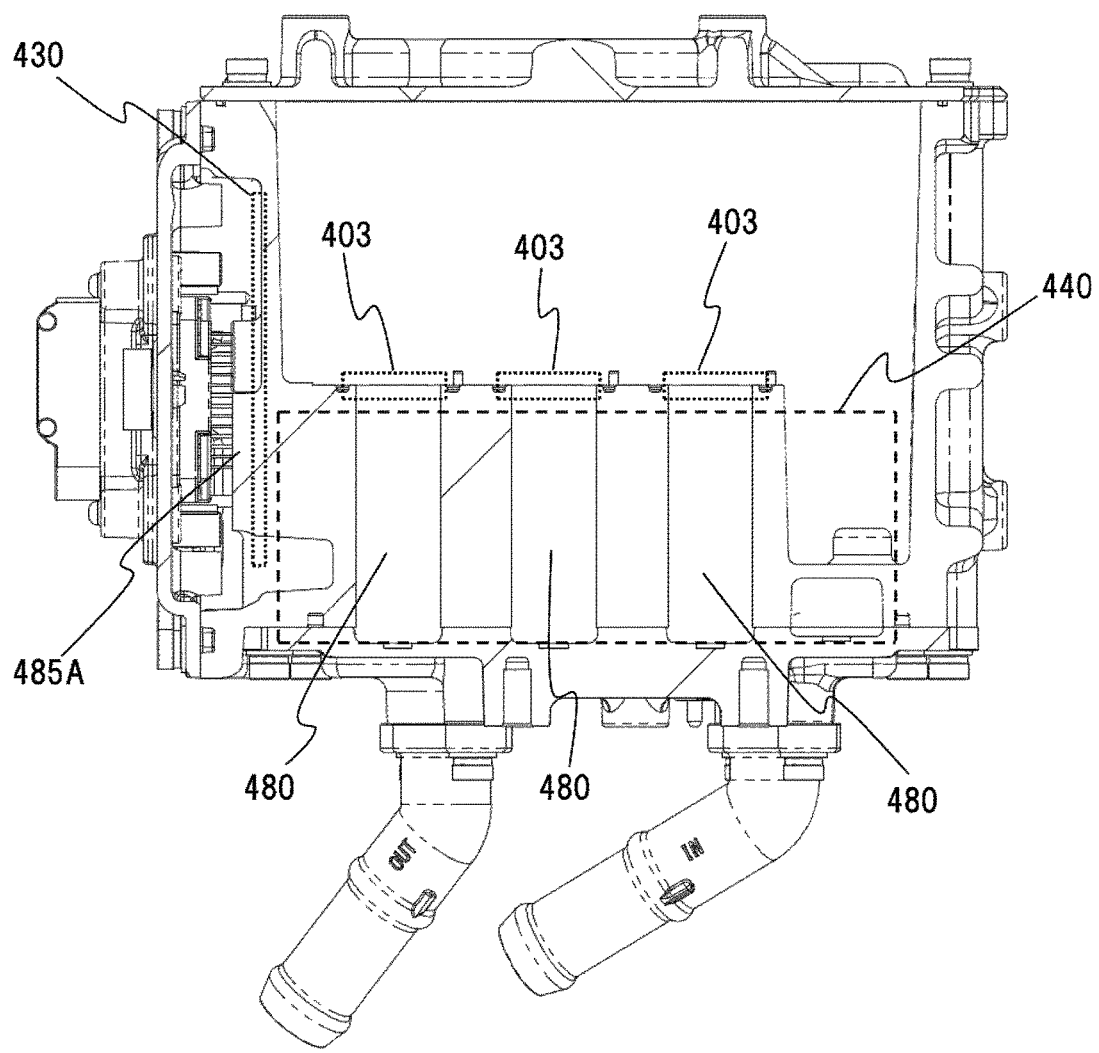
FIG. 8 is a cross-sectional view of the power converter 200 in FIG. 7, where components are removed, configured only by a passage forming body 400, an upper cover 419, and a side cover 422.

FIG. 7 is a cross-sectional view of the power converter 200 cut along a plane A illustrated in FIG. 3. FIG. 8 is a cross-sectional view of the power converter 200 in FIG. 7, where components are removed, configured only by a passage forming body 400, an upper cover 419, and a side cover 422.

The power semiconductor modules 300a to 300c are inserted from the opening 403 and disposed in the passage space 480 of the passage forming body 440. This allows the power semiconductor module to be disposed opposite to the passage space 480. In the present embodiment, although the power semiconductor modules 300a to 300c are disposed inside the passage space 480, a plurality of passage pipes having a passage formed therein may be provided such that the power semiconductor modules 300a to 300c are interposed between the passage pipes.

The driver circuit substrate 418 is disposed at a position opposite to a surface of the passage forming body 440 having the opening 403 formed thereon. The passage forming body 440 forms a side surface part 430 formed in parallel to an alignment direction of the power semiconductor module 300a and the driver circuit substrate 418. In the present embodiment, the side surface part 430 is formed integrally with the passage forming body 440. However, the side surface part 430 may be configured separately from the passage forming body 440 may be thermally connected to the passage forming body 440 through a heat radiation sheet or the like.

A protruding portion 485A is formed on the side surface part 430 and protrudes toward the control circuit substrate 421. An edge of the protruding portion 485A is thermally in contact with the control circuit substrate 421. For example, a heat radiation sheet or a heat radiation grease is disposed between the protruding portion 485A and the control circuit substrate 421.

Furthermore, the power semiconductor module 300a is disposed in the passage space 480 such that a first passage space 481 is provided between one of inner walls of the passage space 480 illustrated in FIG. 8 and the first heat radiation part 307A of the power semiconductor module 300a and that a second passage space 482 is provided between another inner wall of the passage space 480 and the second heat radiation part 07B.

Moreover, the side surface part 430 is formed opposite to the power semiconductor module 300a across the first passage space 481.

This allows the side surface part 430 to be effectively cooled by the one inner wall of the passage space 480 forming the first passage space 481, thereby improving cooling performance of the control circuit substrate 421.

Figure 9:
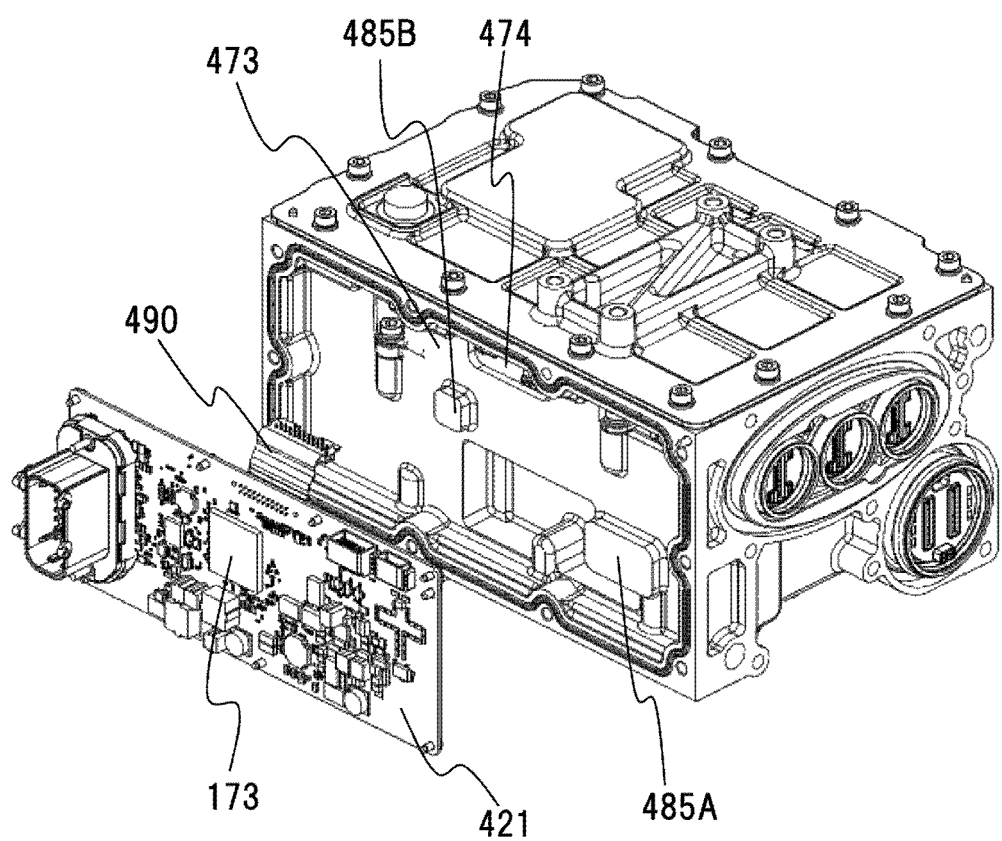
FIG. 9 is an exploded perspective view of the power converter 200 where the side surface cover 422 is removed and a control circuit substrate 421 is disintegrated.

FIG. 9 is an exploded perspective view of the power converter 200 where the side surface cover 422 is removed and a control circuit substrate 421 is disintegrated.

In the present embodiment, a protruding portion 485B is formed on the side surface part 430 separately from the protruding portion 485A. This further improves heat radiation performance of the control circuit substrate 421. However, one of the protruding portion 485A and protruding portion 485B may not be included.

Furthermore, as illustrated in FIG. 7, a first storage space 471 is provided among a surface where the opening 403 of the passage forming body 440 is formed, an inner wall of the housing 400, and the upper cover 419. The driver circuit substrate 418 is disposed in the first storage space 470. A second storage space 472 is disposed between the side surface part 430 of the passage forming body 440 and the side surface cover 422. The control circuit substrate 421 is disposed in the second storage space 472.

A wall 473 separates the first storage space 471 and the second storage space 472. As illustrated in FIG. 9, an opening 474 is formed on the wall 473 such that the first storage space 471 is communicated with the second storage space 472.

Wiring 490 runs through the opening 474 and electrically connects the driver circuit substrate 418 and the control circuit substrate 421. This allows for shielding the driver circuit substrate 418 against radiated electromagnetic noise with the wall 473, thereby protecting the control circuit substrate 421 from the electromagnetic noise.

Figure 10:
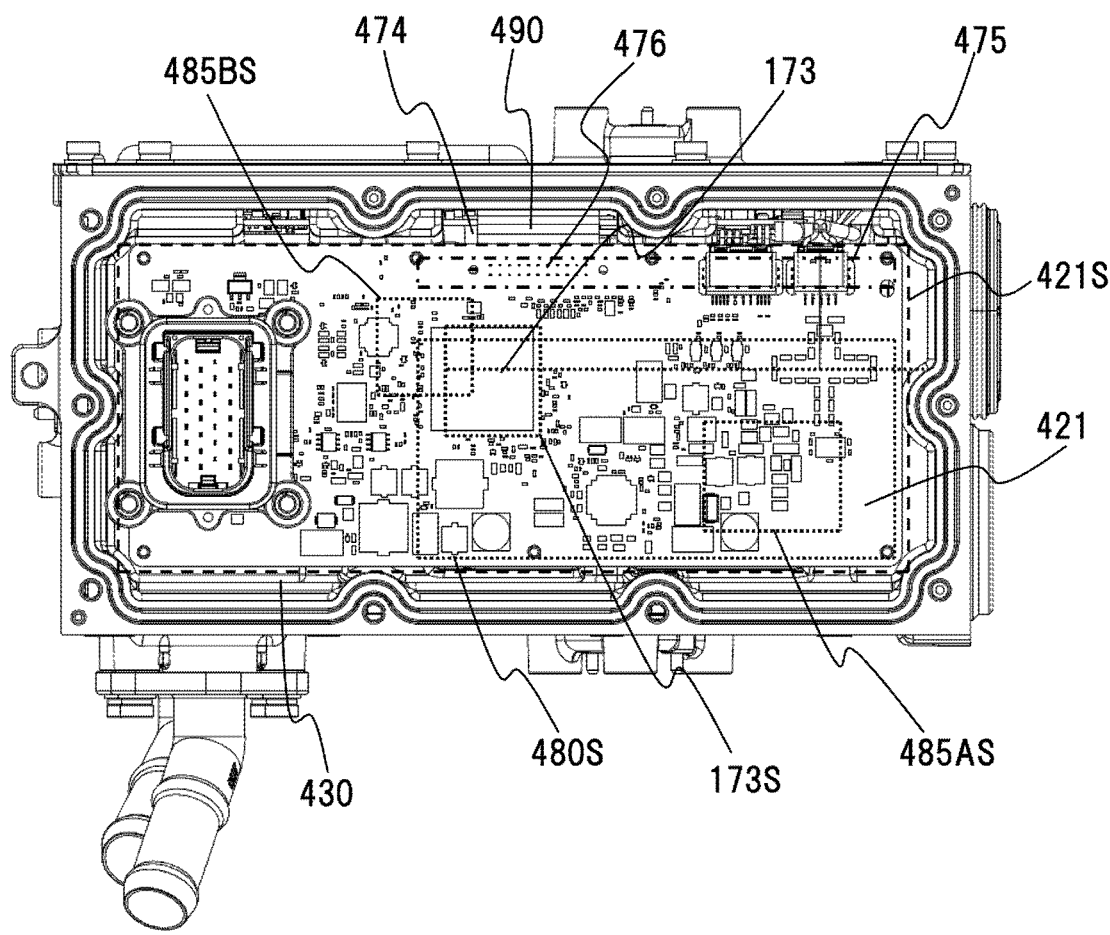
FIG. 10 is a side view of the power converter 200, where the side surface cover 422 is removed, seen from a side where the control circuit substrate 421 is disposed.

FIG. 10 is a side view of the power converter 200, where the side surface cover 422 is removed, seen from a side where the control circuit substrate 421 is disposed.

A projection 421S is a projection of the control circuit substrate 421 when a projection is made from a perpendicular direction to the side surface part 430. A projection 480S is a projection of the passage space 480 when a projection is made from a perpendicular direction to the side surface part 430.

The control circuit substrate 421 is disposed on the side surface part 430 such that the projection 421S of the control circuit substrate 421 matches the projection 480S of the passage space 480 via the protruding portion 485A or protruding portion 485B protruding from the side surface part 430.

This allows the control circuit substrate 421 to be disposed in a space with preferable cooling performance, thereby improving reliability of electronic parts on the control circuit substrate 421. Also, a projection 485AS is a projection of the protruding portion 485A. A projection 485BS is a projection of the protruding portion 485B. The protruding portion 485A or protruding portion 485B is formed such that the projection 485AS or projection 485BS thereof matches the projection 421S of the control circuit substrate 421 and the projection 480S of the passage space 480. This allows for further improving cooling performance of the control circuit substrate 421.

Moreover, the control circuit substrate 421 is disposed on, from among surfaces of the power converter 200, a surface different from a surface disposed with the driver circuit substrate 418. This allows the control circuit substrate 421 to be protected from electromagnetic noise generated from the driver circuit substrate 418.

Also, in the power converter 200, a metal plate or the like for electromagnetic shield which is disposed between the control circuit substrate 421 and the driver circuit substrate 418 is not required, thus allowing for downsizing and cost reduction with less number of parts.

As illustrated in FIG. 8, the protruding portion 485A and protruding portion 485B are formed integrally with the passage forming body 440 from a same material. This allows the protruding portion 485A and protruding portion 485B to be cooled by the coolant, thereby further improving cooling performance of the control circuit substrate 421.

Also, as illustrated in FIG. 10, the control circuit substrate 421 has a first region 475 opposite to an opening surface of the opening 474. Furthermore, the control circuit substrate 421 is provided with a connecting part 476 connected to the wiring 490 at a position matching the first region 475. This allows for shortening the wiring 490 connecting the control circuit substrate 421 and driver circuit substrate 418, and thus much less electromagnetic noise from outside can affect the wiring 490. Also, shorter wiring 490 results in an effect of mitigating wiring impedance.

Also, as illustrated in FIG. 10, the control circuit substrate 421 includes a microcomputer 173 for performing arithmetic operation for switching operation of the power semiconductor element. The microcomputer 173 is disposed such that a projection 173S of the microcomputer 173 matches the projection 480S of the passage space 480. This allows for effective cooling of the microcomputer 173 having a relatively high calorific value from among circuit parts mounted on the control circuit substrate 421.

Figure 11:
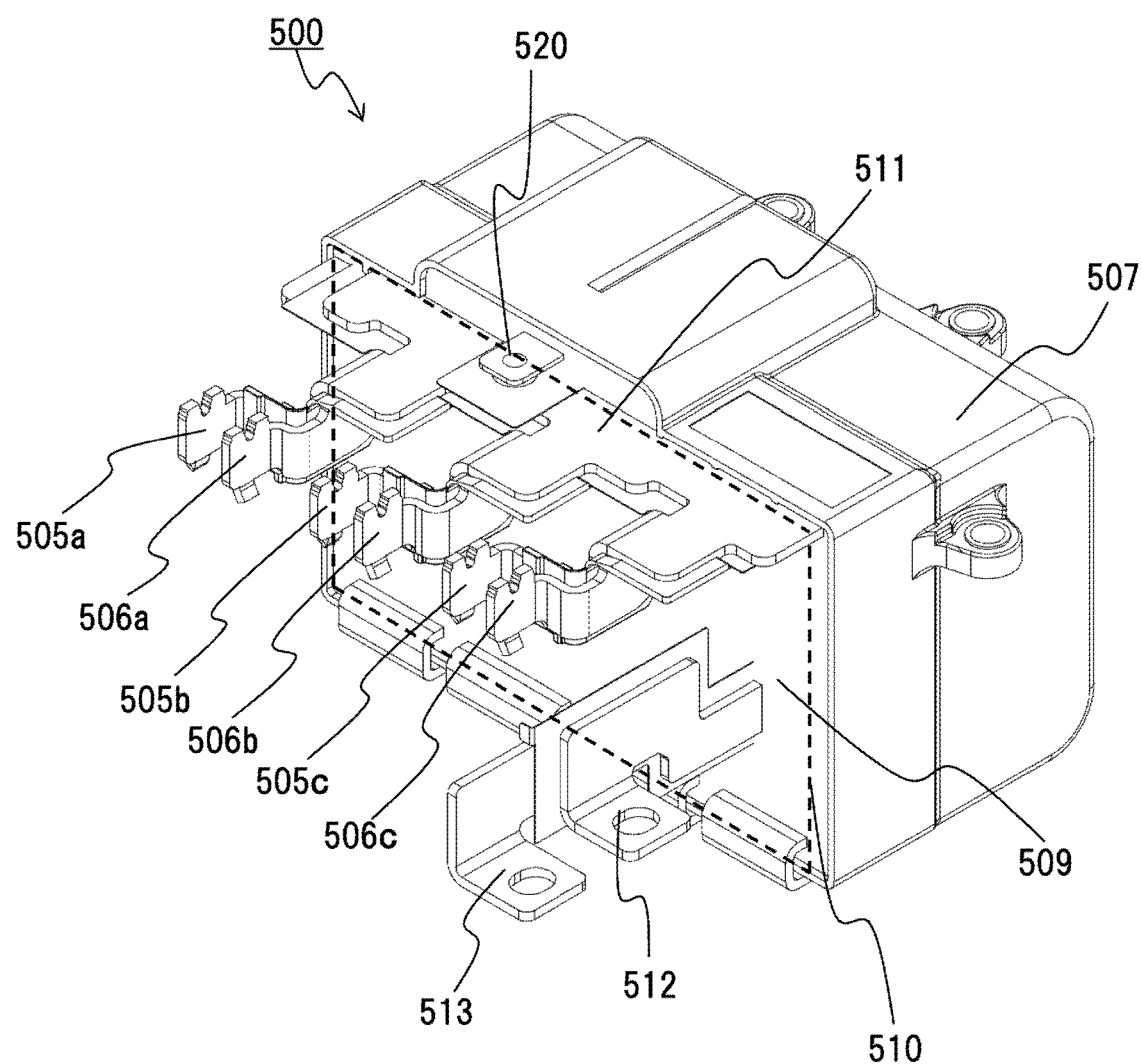
FIG. 11 is an external perspective view of a capacitor module 500 seen from a side where a capacitor terminal is formed.
Figure 12:
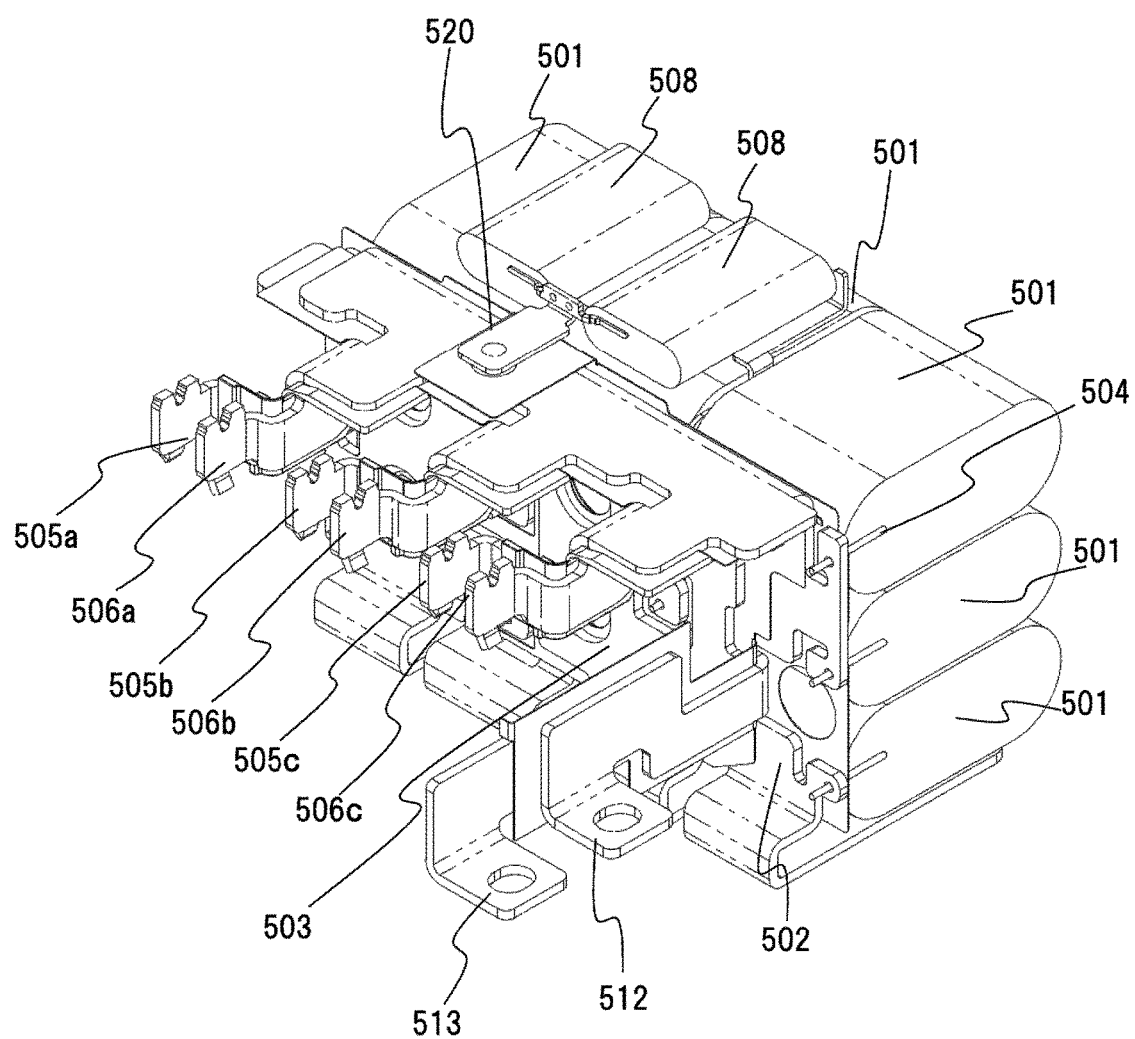
FIG. 12 is an external perspective view of the capacitor module 500 illustrated in FIG. 11, where a capacitor case 501 is removed.
Figure 13:
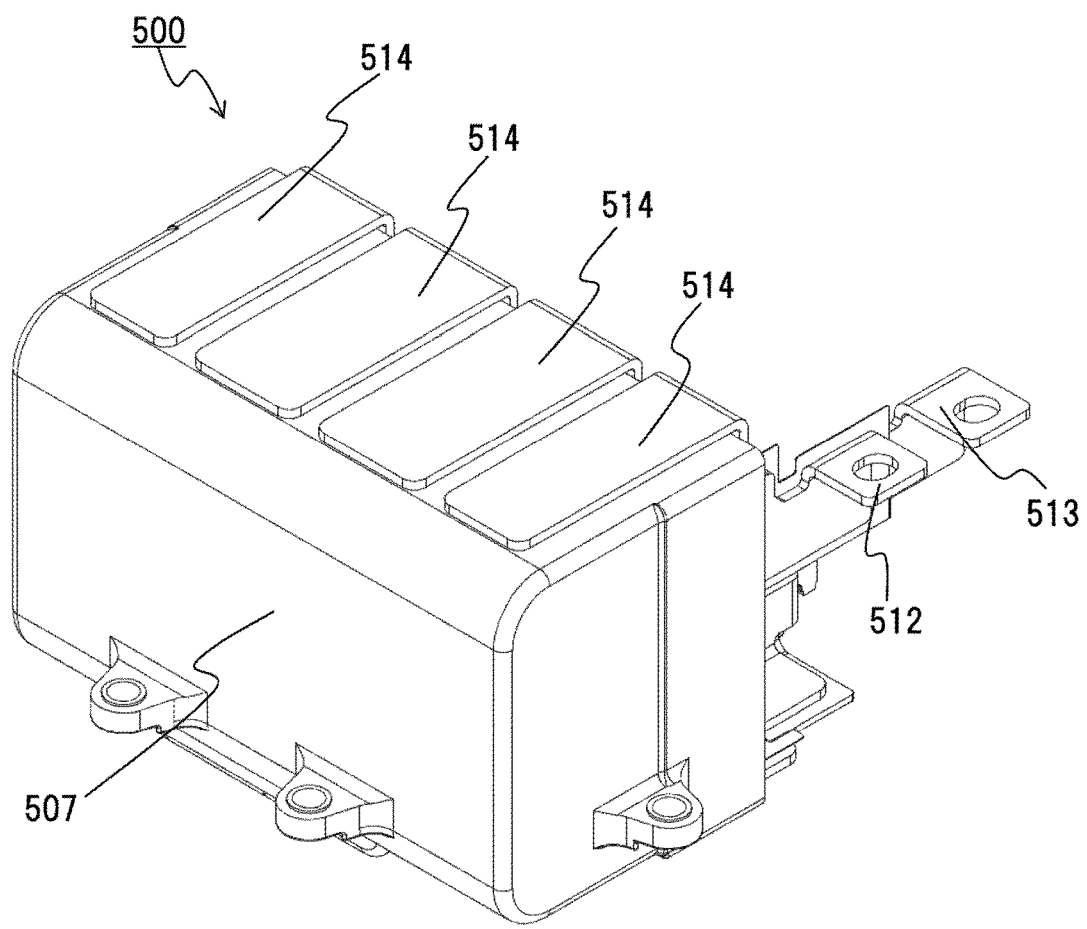
FIG. 13 is an external perspective view of the capacitor module 500 seen from a side where the capacitor terminal is not formed.
Figure 14:
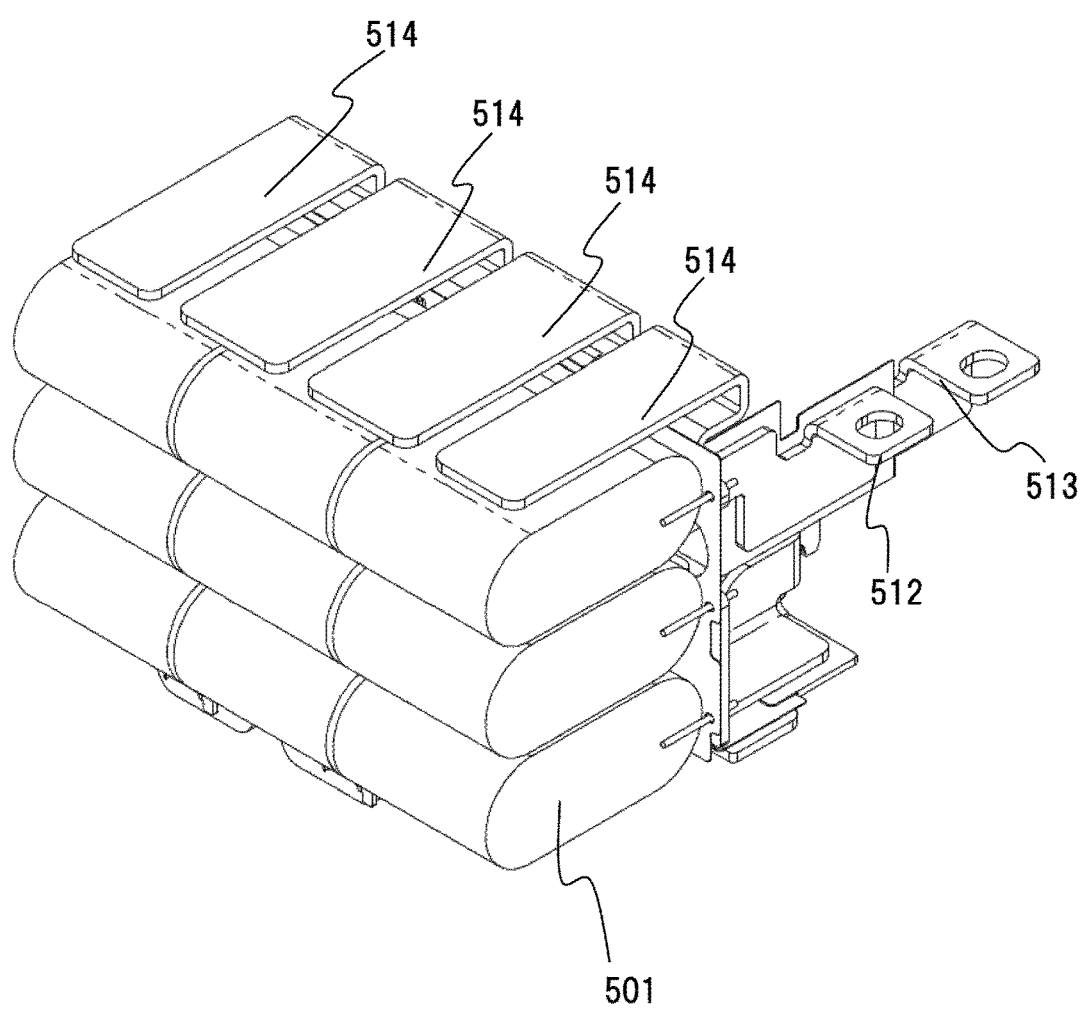
FIG. 14 is an external perspective view of the capacitor module 500 illustrated in FIG. 13, where the capacitor case 501 is removed.
Figure 15:
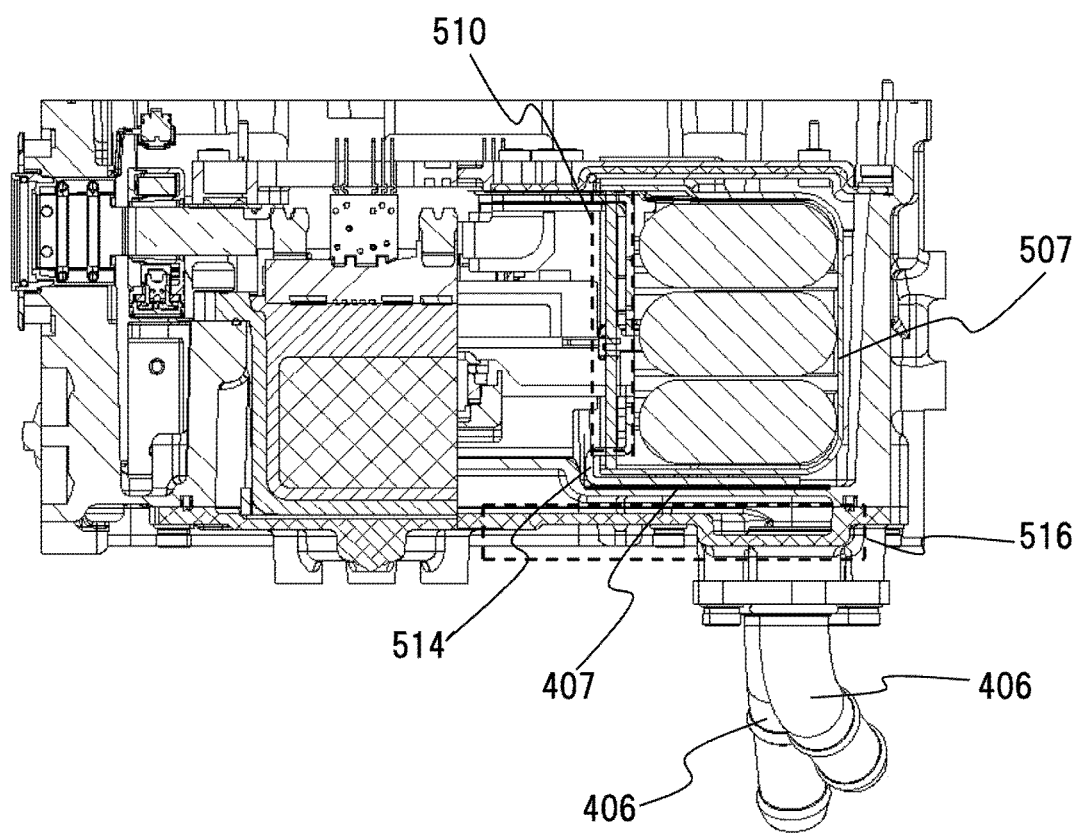
FIG. 15 is a cross-sectional view of the power converter 200 cut along a plane B in FIG. 3.

FIG. 11 is an external perspective view of a capacitor module 500 seen from a side where a capacitor terminal is formed. FIG. 12 is an external perspective view of the capacitor module 500 illustrated in FIG. 11, where the capacitor case 501 is removed. FIG. 13 is an external perspective view of the capacitor module 500 seen from a side where the capacitor terminal is not formed. FIG. 14 is an external perspective view of the capacitor module 500 illustrated in FIG. 13, where the capacitor case 501 is removed. FIG. 15 is a cross-sectional view of the power converter 200 cut along a plane B in FIG. 3.

A capacitor element 501 filters DC power and supplies the DC power to the power semiconductor modules 300a to 300c. A positive side capacitor conductor plate 502 is connected to a positive side electrode of the capacitor element 501 via a lead terminal 504. A negative side capacitor conductor plate 503 is connected to a negative side electrode of the capacitor element 501 via a lead terminal (not illustrated).

A noise-removing capacitor 508 has a smaller capacitance than the capacitor element 501 and filters ripple current caused by noise. A capacitor case 507 houses the capacitor element 501, positive side capacitor conductor plate 502, negative side capacitor conductor plate 503, and noise-removing capacitor 508.

A sealing material 509 illustrated in FIG. 11 is filled to a storage space in the capacitor case 507. The capacitor case 507 has an opening 510 formed on a surface thereof. A conductor protruding portion 511 protrudes from the opening 510. Positive side capacitor terminals 505a to 505c and negative side capacitor terminals 506a to 506c bifurcate from the conductor protruding portion 511.

The positive side capacitor terminal 505a is connected to the DC positive terminal 315B of the power semiconductor module 300a. The positive side capacitor terminal 505b is connected to the DC positive terminal 315B of the power semiconductor module 300b. The positive side capacitor terminal 505c is connected to the DC positive terminal 315B of the power semiconductor module 300c.

The negative side capacitor terminal 506a is connected to the DC negative terminal 319B of the power semiconductor module 300a. The negative side capacitor terminal 506b is connected to the DC negative terminal 319B of the power semiconductor module 300b. The negative side capacitor terminal 506c is connected to the DC negative terminal 319B of the power semiconductor module 300c.

A positive side power supply terminal 512 is connected to the positive side capacitor conductor plate 502 and protrudes from the opening 510. A negative side power supply terminal 513 is connected to the negative side capacitor conductor plate 503 and protrudes from the opening 510. The positive side capacitor conductor plate 502 has a conductor heat radiation part 514 protruding from the opening 510.

As illustrated in FIG. 15, the conductor heat radiation part 514 is thermally in contact with the passage forming body forming the passage space communicating with the pipe 406 via the heat radiation sheet 407 on a side of the passage. This allows for effectively radiating heat transferred from the positive side power supply terminal 512 or DC positive terminal 315B or heat transferred from the capacitor element 501.

Also, as illustrated in FIG. 15, the capacitor case 507 is disposed in the passage forming body such that the opening 510 faces the power semiconductor modules 300a to 300c. The conductor heat radiation part 514 is formed along an outer wall of the capacitor case 507 such that the conductor heat radiation part 514 is disposed in a space between the capacitor case 507 and passage forming body.

This allows for shortening the length of the positive side capacitor terminals 505a to 505c and the negative side capacitor terminals 506a to 506c and also shortening a heat-transferring distance of the conductor heat radiation part 514, thereby further improving heat radiation performance of the capacitor module 500.

Figure 16:
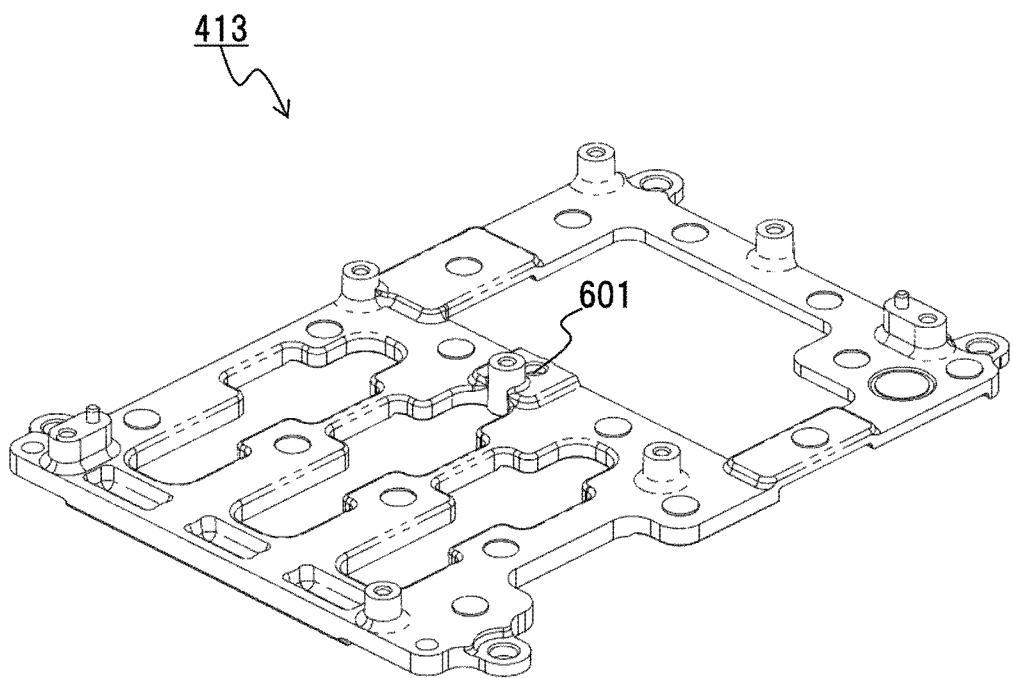
FIG. 16 is a general perspective view of a cooling board 413 seen from a side of a top surface.
Figure 17:
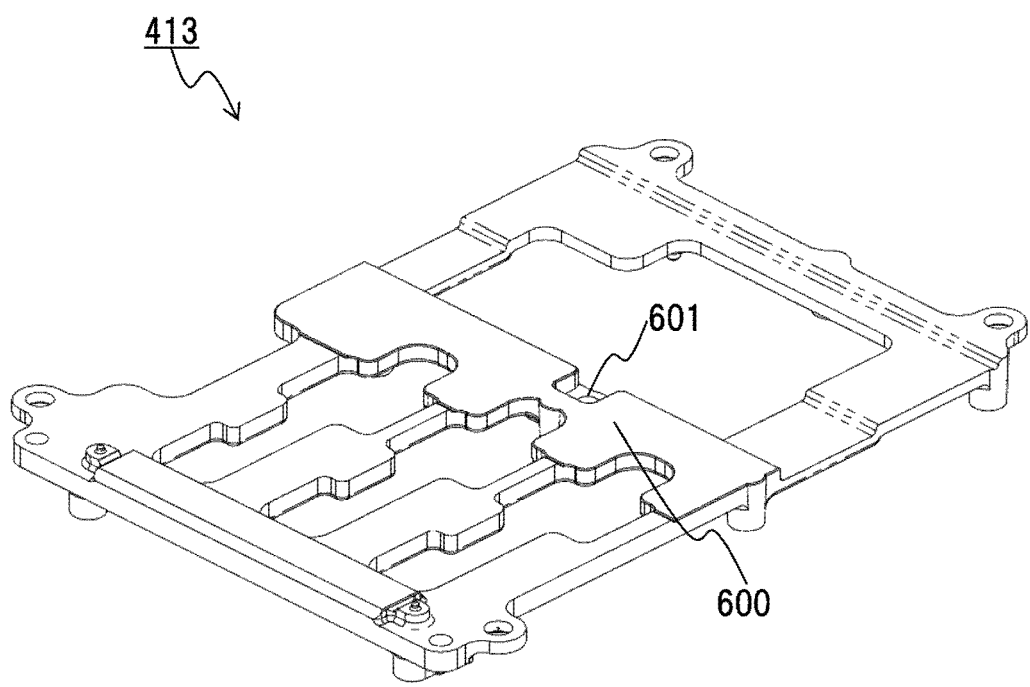
FIG. 17 is a general perspective view of the cooling board 413 seen from a side of a lower surface.

FIG. 16 is a general perspective view of the cooling board 413 seen from a side of a top surface. FIG. 17 is a general perspective view of the cooling board 413 seen from a side of a lower surface.

The cooling board 413 has a heat receiving surface 600 thermally in contact with the conductor protruding portion 511 of the capacitor module 500 via the heat radiation sheet 415. The conductor protruding portion 511 is one plate and protrudes from the opening 510 and bifurcates into the positive side capacitor terminals 505a to 505c at an edge thereof.

Such a configuration allows the conductor protruding portion 511 to be in contact with the heat receiving surface 600 of the cooling board 413 by a wide area, thereby improving cooling performance. Especially, a reflux circuit upon switching between the plurality of power semiconductor modules 300a to 300c flows in the conductor protruding portion 511. Therefore, causing this part to protrude from the opening 510 to be in contact with the cooling board 413 largely contributes improvement of cooling performance.

Also, a grounding terminal 520 illustrated in FIG. 11 is connected to the noise-removing capacitor 508. The grounding terminal 520 protrudes from the opening 510 from a side closer to the cooling board 413. In the present embodiment, the grounding terminal 520 protrudes from the opening 510 such that the grounding terminal 520 is disposed in a space between the conductor protruding portion 511 and the cooling board 413.

A grounding connecting part 601 is formed in the cooling board 413 and is connected to the grounding terminal 520. The grounding connecting part 601 is formed at a position opposite to the grounding terminal 520. The cooling board 413 is connected to the metal housing 400. This allows the noise-removing capacitor 508 to be grounded via the cooling board 413, allowing the cooling board 413 to have both a heat radiation function and a grounding function. This contributes to a reduced number of parts or downsizing of the power converter 200.

REFERENCE SIGNS LIST 140 inverter circuit unit
156 diode
166 diode
172 control circuit unit
173 microcomputer
174 driver circuit
200 power converter
300a to 300c power semiconductor module
304 module case
304A thin part
305 fin
306 insertion opening
307A first heat radiation part
307B second heat radiation part
315A DC positive wiring
315B DC positive terminal
319A DC negative wiring
319B DC negative terminal
324 signal conductor
325U, 325L signal terminal
328 IGBT
330 IGBT
333 insulating sheet
341 conductor plate
342 conductor plate
348 first sealing resin
400 housing
400A first long side wall
400B second long side wall
400C first short side wall
400D second short side wall
400E side wall
402 storage part
403 opening
406 pipe
407 heat radiation sheet
408 AC terminal
409 DC side storage opening
410 AC side storage opening
411 current sensor
413 cooling board
416 AC connecting bus bar
418 driver circuit substrate
419 upper cover
421 control circuit substrate
421S projection
430 side surface part
440 passage forming body
470 AC terminal
473 wall
474 opening
475 first region
480 passage space
480S projection
481 first passage space
482 second passage space
485A protruding portion
485B protruding portion
485AS projection
485BS projection
490 wiring
500 capacitor module
501 capacitor element
502 positive side capacitor conductor plate
503 negative side capacitor conductor plate
504 negative side capacitor terminal
505a to 505c positive side capacitor terminal
506a to 506c negative side capacitor terminal
507 capacitor case
508 noise-removing capacitor
509 sealing material
510 opening
511 conductor protruding portion
512 positive side power supply terminal
513 negative side power supply terminal
514 conductor heat radiation part
520 grounding terminal
600 heat receiving surface
601 grounding connecting part

The invention claimed is:

1. A power converter comprising:
a power semiconductor module having a power semiconductor element configured to convert a DC current to an AC current;
a passage forming body configured to form a passage space;
a driver circuit substrate configured to drive the power semiconductor element; and
a control circuit substrate configured to control the driver circuit substrate, wherein
the passage forming body has a first surface and a side surface part formed in parallel to a direction perpendicular to the first surface,
the driver circuit substrate is disposed at a position opposite to the first surface, and
the control circuit substrate is disposed on the side surface part such that a projection of the control circuit substrate matches a projection of the passage space when a projection is made from a direction perpendicular to the side surface part of the passage forming body.

2. The power converter according to claim 1, wherein
the passage forming body forms a first opening for disposing the power semiconductor module in an opposing manner to the passage space, and
the driver circuit substrate is disposed at a position opposite to the first surface of the passage forming body having the first opening formed thereon.

3. The power converter according to claim 2, wherein the control circuit substrate is disposed on the side surface part of the passage forming body via a protruding portion protruding from the side surface part.

4. The power converter according to claim 3, wherein
the passage forming body is formed such that the first opening communicates with the passage space,
the power semiconductor module has a first heat radiation part opposite to the power semiconductor element and a second heat radiation part opposite to the first heat radiation surface across the power semiconductor element,
the power semiconductor module is further disposed with the passage space such that a first passage space is formed between one of inner walls of the passage space and the first heat radiation surface and that a second passage space is formed between another inner wall of the passage space and the second heat radiation surface, and
the side surface part is formed opposite to the power semiconductor module across the first passage space.

5. The power converter according to claim 3, wherein the protruding portion is integrally molded with the passage forming body from a same material.

6. The power converter according to claim 1, further comprising:
wiring configured to electrically connect the driver circuit substrate and the control circuit substrate;
a housing configured to house the passage forming body; and
a cover fixed to the housing such that the side surface part of the passage forming body is covered, wherein
the housing forms a first storage space provided between an inner wall of the housing and the first surface of the passage forming body, a second storage space provided between the side surface part of the passage forming body and the cover, a wall separating the first storage space and the second storage space, and a second opening formed on the wall,
the driver circuit substrate is disposed in the first storage space,
the control circuit substrate is disposed in the second storage space, and
the wiring connects the driver circuit substrate and the control circuit substrate via the second opening.

7. The power converter according to claim 6, wherein
the control circuit substrate has a first region opposite to an opening surface of the second opening, and
the wiring is connected to a position matching the first region of the control circuit substrate.

8. The power converter according to claim 1, wherein
the control circuit substrate has a microcomputer configured to perform arithmetic operation for switching operation of the power semiconductor element, and
the microcomputer is disposed such that a projection of the microcomputer matches a projection of the passage space.

9. The power converter according to claim 1, further comprising:
a capacitor module configured to filter DC power; and
a passage side heat radiation sheet disposed on the passage forming body, wherein
the capacitor module comprises a capacitor element, a capacitor side conductor part electrically connected to an electrode of the capacitor element, and a capacitor case configured to house a part of the capacitor side conductor part and the capacitor element, and
the capacitor side conductor part protrudes from an opening of the capacitor case and has a conductor heat radiation part contacting the passage side heat radiation sheet.

10. The power converter according to claim 9, wherein
the capacitor case is disposed on the passage forming body such that the opening of the capacitor case faces the power semiconductor module, and
the conductor heat radiation part is formed along an outer wall of the capacitor case such that the conductor heat radiation part is disposed in a space between the capacitor case and the passage forming body.

11. The power converter according to claim 1, further comprising:
a capacitor module configured to filter DC power;
a housing configured to house the passage forming body;
a metal cooling board configured to electrically and thermally contact the housing; and
a board side heat radiation sheet contacting the metal cooling board, wherein
the capacitor module comprises a capacitor element, a first capacitor side conductor part electrically connected to an electrode of the capacitor element, a noise-removing capacitor element having a smaller electrical capacitance than the capacitor element, a grounding terminal connected to the noise-removing capacitor, and a capacitor case configured to house a part of the capacitor side conductor part and the capacitor element,
the capacitor case is disposed on the passage forming body such that an opening of the capacitor case faces the power semiconductor module,
the first capacitor side conductor part protrudes from the opening of the capacitor case and contacts the board side heat radiation sheet and is further formed toward an alignment direction of the power semiconductor module, and the grounding terminal protrudes from the opening of the capacitor case and contacts the metal cooling board.

* * * * *